United States Patent
Kwon et al.

(10) Patent No.: US 8,946,720 B2
(45) Date of Patent: Feb. 3, 2015

(54) ORGANIC LIGHT EMITTING DIODE DISPLAY DEVICE AND METHOD OF MANUFACTURING THE SAME

(75) Inventors: Do-Hyun Kwon, Yongin (KR); Choong-Youl Im, Yongin (KR); Dae-Hyun No, Yongin (KR); Jong-Mo Yeo, Yongin (KR); Ju-Won Yoon, Yongin (KR); Il-Jeong Lee, Yongin (KR); Song-Yi Jeon, Yongin (KR); Cheol-Ho Yu, Yongin (KR)

(73) Assignee: Samsung Display Co., Ltd., Giheung-Gu, Yongin, Gyeonngi-Do (KR)

( * ) Notice: Subject to any disclaimer, the term of this patent is extended or adjusted under 35 U.S.C. 154(b) by 676 days.

(21) Appl. No.: 12/980,540

(22) Filed: Dec. 29, 2010

(65) Prior Publication Data

US 2011/0168985 A1   Jul. 14, 2011

(30) Foreign Application Priority Data

Jan. 8, 2010   (KR) ................. 10-2010-0001723

(51) Int. Cl.
*H01L 29/04* (2006.01)
*H01L 21/336* (2006.01)
*H01L 51/52* (2006.01)
*H01L 27/32* (2006.01)

(52) U.S. Cl.
CPC ........ *H01L 51/5215* (2013.01); *H01L 27/3246* (2013.01); *H01L 2227/323* (2013.01)
USPC .................. 257/72; 257/59; 257/60

(58) Field of Classification Search
CPC .......... H01L 27/3244; H01L 27/3246
USPC .................. 257/59–72, E27.132
See application file for complete search history.

(56) References Cited

U.S. PATENT DOCUMENTS

| | | | |
|---|---|---|---|
| 7,420,212 B2 * | 9/2008 | Kim et al. | 257/72 |
| 7,459,850 B2 | 12/2008 | Cok | |
| 7,550,769 B2 * | 6/2009 | Yamazaki et al. | 257/72 |
| 7,557,494 B2 | 7/2009 | Adachi | |
| 7,595,854 B2 | 9/2009 | Sung et al. | |
| 7,692,381 B2 | 4/2010 | Kwon et al. | |
| 7,749,039 B2 | 7/2010 | Park | |

(Continued)

FOREIGN PATENT DOCUMENTS

| | | |
|---|---|---|
| KR | 1020050105852 A | 11/2005 |
| KR | 10-2006-0018767 | 3/2006 |

(Continued)

*Primary Examiner* — Cuong Q Nguyen
(74) *Attorney, Agent, or Firm* — Robert E. Bushnell, Esq.

(57) ABSTRACT

An organic light emitting diode display device and a method of manufacturing the same are disclosed. The organic light emitting diode display device includes a substrate having an emission section and a non-emission section, a semiconductor layer located on the substrate, a gate dielectric layer located over an entire front surface of the substrate, a gate electrode located in correspondence to the semiconductor layer, a dielectric layer located over the entire front surface of the substrate, source and drain electrodes and a first electrode located on the dielectric layer and electrically connected to the semiconductor layer, a pixel definition layer exposing a part of the first electrode, a spacer located on the pixel definition layer and located on the non-emission section of the substrate, an organic film layer located on the first electrode, and a second electrode located over the entire front surface of the substrate.

7 Claims, 18 Drawing Sheets

(56) References Cited

U.S. PATENT DOCUMENTS

| | | |
|---|---|---|
| 7,777,225 B2 | 8/2010 | Lee et al. |
| 2007/0052352 A1* | 3/2007 | Im et al. ............ 313/506 |
| 2007/0170839 A1 | 7/2007 | Choi et al. |
| 2008/0160864 A1 | 7/2008 | Song et al. |
| 2008/0277666 A1* | 11/2008 | Jeon et al. ............ 257/66 |
| 2008/0315756 A1 | 12/2008 | Jeon et al. |
| 2009/0008667 A1* | 1/2009 | Fujii et al. ............ 257/98 |
| 2009/0009055 A1 | 1/2009 | Han et al. |
| 2009/0058294 A1 | 3/2009 | Joo et al. |
| 2009/0189517 A1 | 7/2009 | Choi et al. |
| 2010/0097295 A1 | 4/2010 | Kwak |

FOREIGN PATENT DOCUMENTS

| | | |
|---|---|---|
| KR | 1020070055908 A | 5/2007 |
| KR | 10-2007-0068092 | 6/2007 |
| KR | 10-2008-0014328 A | 2/2008 |
| KR | 10-2008-0047777 | 5/2008 |
| KR | 10-2009-0084202 A | 8/2009 |

* cited by examiner

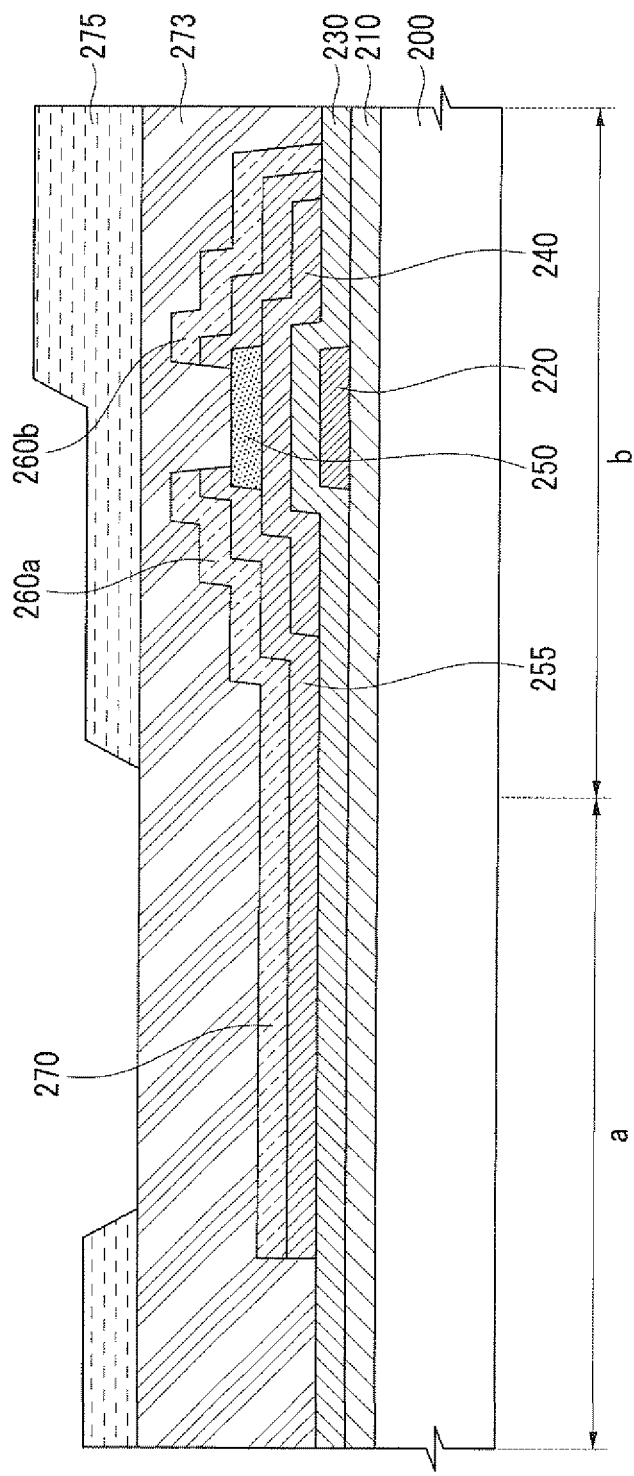

ORGANIC LIGHT EMITTING DIODE DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Jan. 8, 2010 and there duly assigned Serial No. 2010-0001723.

BACKGROUND OF THE INVENTION

1. Field of the Invention

The present invention relates generally to an organic light emitting diode display device and a method of manufacturing the same, to which a 5-mask process can be applied, thereby making it possible to reduce the number of masks, cut down the cost of production, and simplify a process to enhance a yield.

2. Description of the Related Art

Among flat panel display devices, organic light emitting diode display devices exhibit characteristics such as self-emission, wide viewing angle, rapid response speed of 1 ms or less, thin thickness, low manufacturing cost, and high contrast.

The organic light emitting diode display devices includes an organic emission layer between a positive electrode (anode) and a negative electrode (cathode). Thus, holes supplied from the anode and electrons supplied from the cathode are combined in the organic emission layer, thereby forming hole-electron pairs, i.e. excitons. The excitons release energy while returning to a ground state so that light is emitted.

The organic light emitting diode display devices are generally configured to mount a thin film transistor on each pixel, and supply constant current regardless of the number of pixels, so that they can provide stable luminance and low power consumption, and thus they are advantageous for application to high-resolution and large displays.

However, the organic light emitting diode display devices require a considerable number of masks due to a complicated process, and the resultant enormous cost. Thus, to have price competitiveness, a technique capable of reducing the number of masks and processes is acutely required.

SUMMARY OF THE INVENTION

The present invention provides an organic light emitting diode display device which is capable of reducing the number of masks so as to cut down the cost of production and enhance a yield, and a method of manufacturing the same.

The present invention also provides an organic light emitting diode display device including: a substrate having an emission section and a non-emission section; a semiconductor layer located on the substrate; a gate dielectric layer located on an entire front surface of the substrate; a gate electrode located in correspondence to the semiconductor layer; a dielectric layer located on an entire front surface of the substrate; source and drain electrodes and a first electrode located on the dielectric layer and electrically connected to the semiconductor layer, the first electrode being located on the emission section of the substrate; a pixel definition layer exposing a part of the first electrode; a spacer located on the pixel definition layer and located on the non-emission section of the substrate; an organic film layer located on the first electrode; and a second electrode located on an entire front surface of the substrate. The pixel definition layer includes an inorganic layer, and the spacer includes an organic layer.

Additional aspects and/or advantages of the invention will be set forth, in part, in the description which follows and, in part, will be obvious from the description, or may be learned by practice of the invention.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 2A thru 2H illustrate an organic light emitting diode display device according to a second embodiment of the invention.

DETAILED DESCRIPTION OF THE INVENTION

Figure 1A:
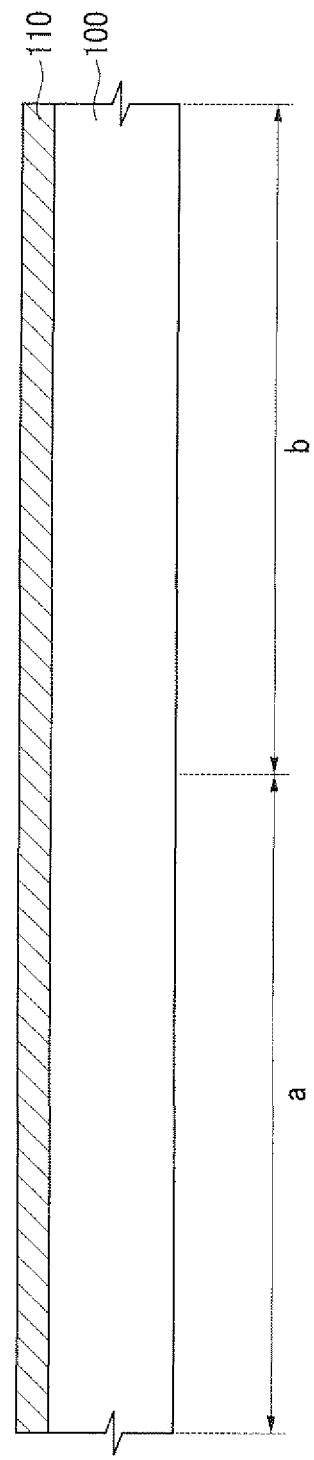
FIGS. 1A thru 1H illustrate an organic light emitting diode display device according to a first embodiment of the invention.

Reference will now be made in detail to the present embodiments, examples of which are shown in the accompanying drawings, wherein like reference numerals refer to the like elements throughout. The embodiments are described below in order to explain the present invention by referring to the figures.

First Embodiment

FIGS. 1A thru 1H illustrate an organic light emitting diode display device according to a first embodiment of the invention.

First, referring to FIG. 1A, a substrate 100 having an emission section a and non-emission section b is provided. The substrate 100 is formed of a material such as glass or plastic. Then, a buffer layer 110 is formed on the substrate 100. The buffer layer 110 is formed of at least one dielectric layer, for instance, a silicon oxide layer and a silicon nitride layer, using chemical or physical vapor deposition.

Figure 1B:
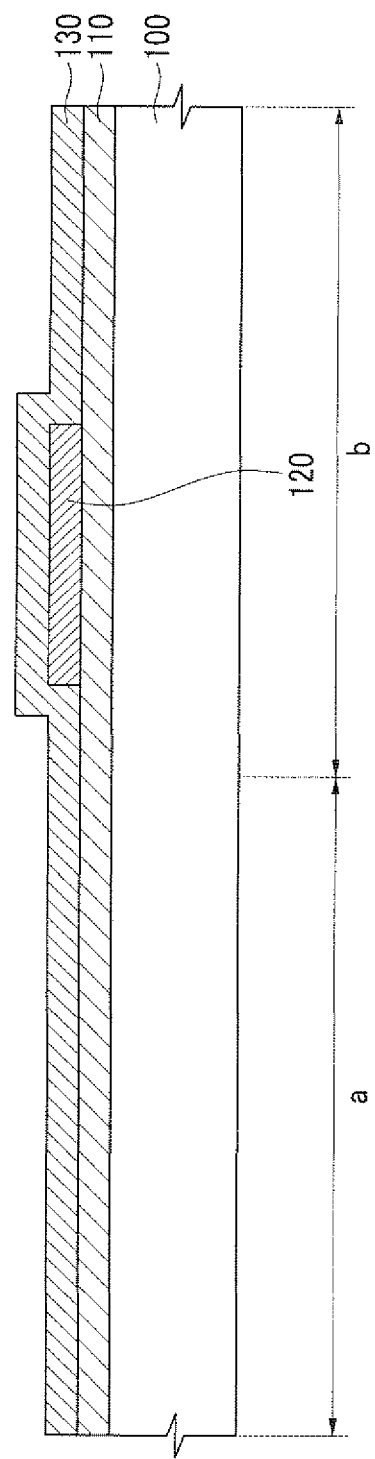

Referring to FIG. 1B, a semiconductor layer 120 is formed on the buffer layer 110 using a first mask. Then, a gate dielectric layer 130 is formed over an entire front surface of the substrate 100. The gate dielectric layer 130 may be formed of a silicon oxide layer, a silicon nitride layer or both of them.

Figure 1C:
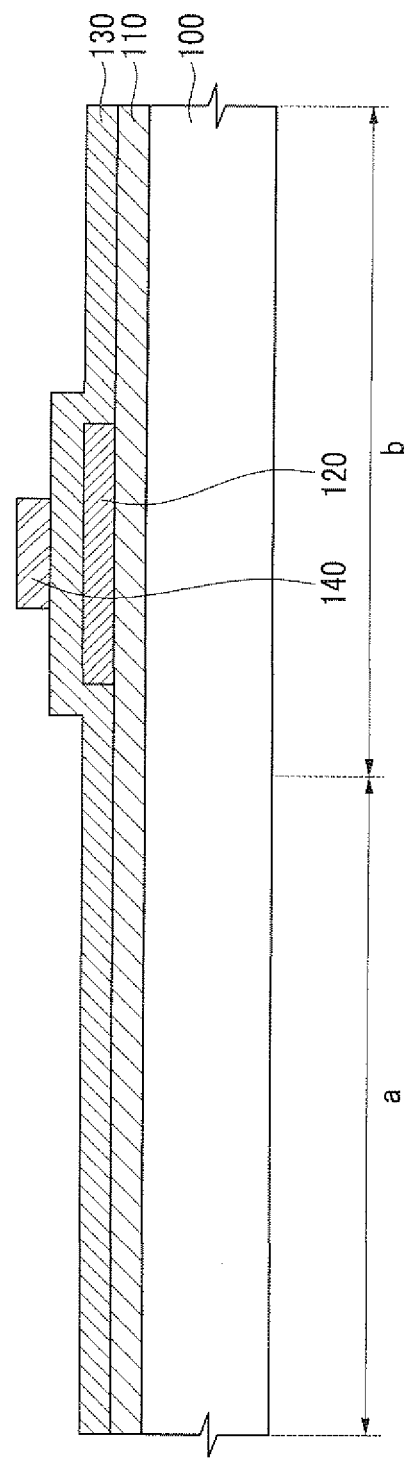

Then, referring to FIG. 1C, a gate electrode 140 is formed on the gate dielectric layer 130 so as to correspond to the semiconductor layer 120. The gate electrode 140 is formed using a second mask. The gate electrode 140 is formed by forming a single layer of aluminum (Al) or an aluminum alloy such as aluminum-neodymium (Al—Nd), or a multiple layer in which an Al alloy is stacked on a chrome (Cr) or molybdenum (Mo) alloy as a metal layer (not shown) for the gate electrode, and etching the metal layer using a photolithography process.

Figure 1D:
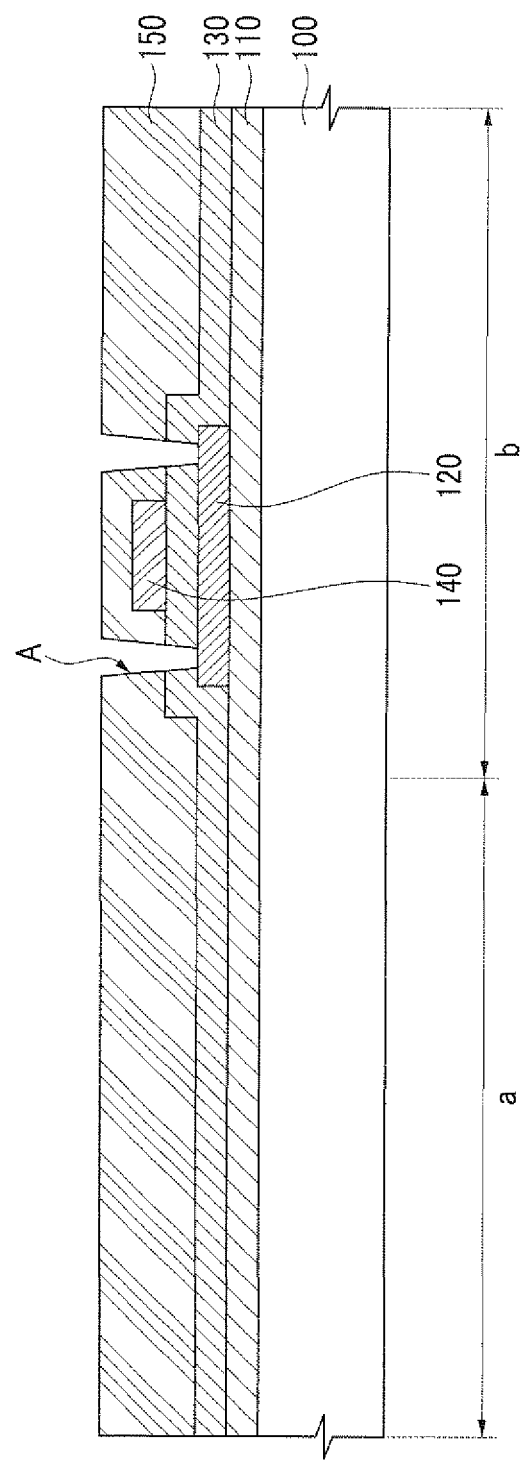

Referring to FIG. 1D, a dielectric layer 150 is formed above the substrate 100 so as to have contact holes A exposing parts of the semiconductor layer 120. The dielectric layer 150 is formed using a third mask, and is formed using a mixture layer in which an inorganic layer such as a silicon nitride layer, a silicon oxide layer, or a multiple layer thereof is mixed with a planarization layer which is made of one selected from the group consisting of benzo cyclo butene (BCB), polyimide (PI), polyamide (PA), acrylic resin, and phenol resin, which are typically used as organic materials.

Figure 1E:
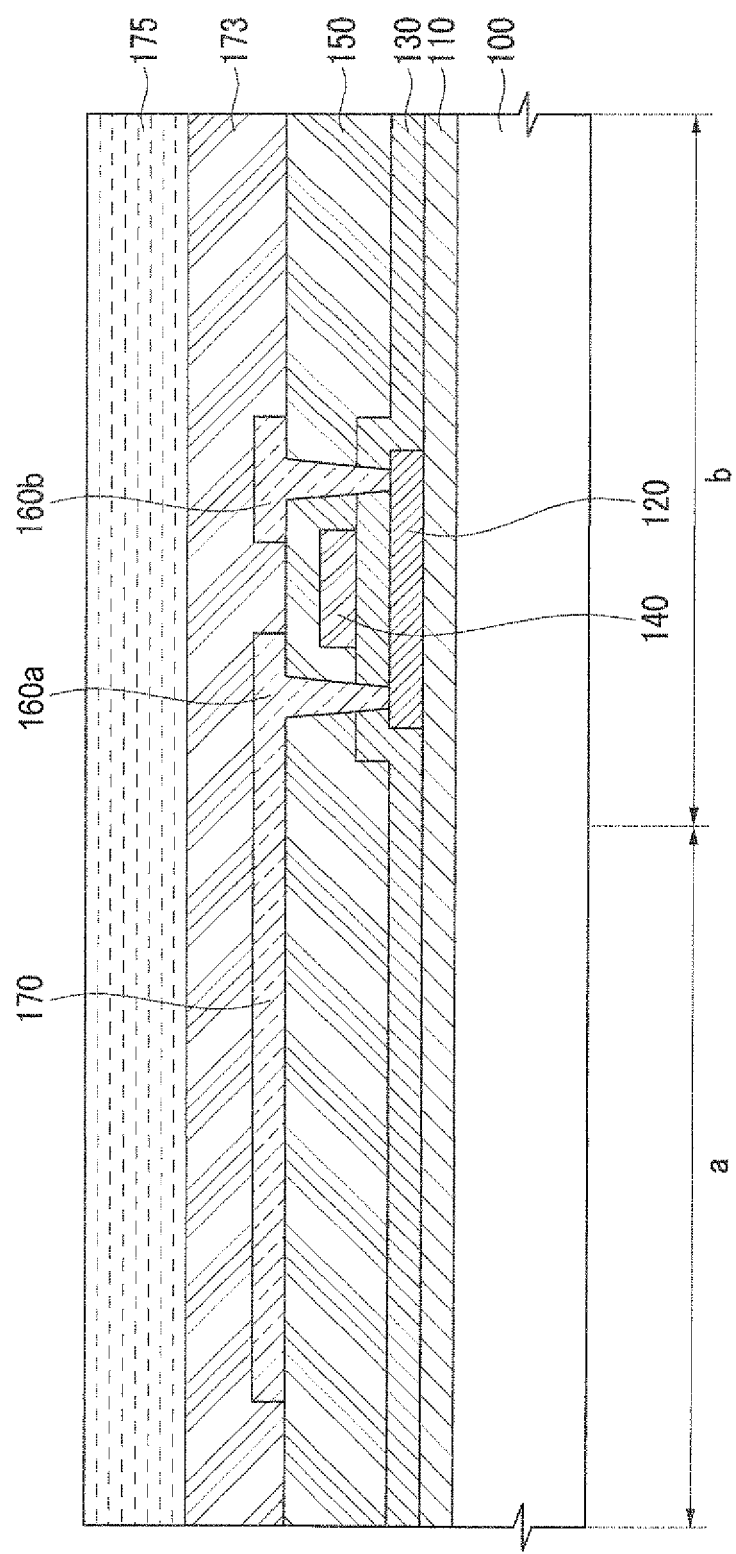

Subsequently, referring to FIG. 1E, source and drain electrodes 160a and 160b, respectively, and a first electrode 170 are formed on the dielectric layer 150 so as to be electrically connected to the semiconductor layer 120.

In this regard, the source and drain electrodes 160a and 160b and the first electrode 170 are simultaneously formed by stacking a metal layer (not shown) for the source and drain electrodes 160a and 160b, respectively, and a metal layer (not shown) for the first electrode 170 using a fourth mask.

The metal layer for the source and drain electrodes 160a and 160b, respectively, may be formed of one selected from molybdenum (Mo), tungsten (W), molybdenum tungsten (MoW), tungsten silicide ($WSi_2$), molybdenum silicide (MoSi2), and aluminum (Al). The metal layer for the first electrode 170 may be formed of one selected from layers including an indium tin oxide (ITO) layer, indium zinc oxide (IZO) layer, and a reflective layer. The reflective layer may be formed of Ag, Al or an alloy thereof.

Then, material layers for a pixel definition layer 173 and a spacer 175 are formed over an entire front surface of the substrate 100. The material layer of the pixel definition layer 173 may be formed using an inorganic layer, preferably a silicon nitride ($SiN_x$) layer. The material layer for the spacer 175 is formed of one selected from the group consisting of BCB, PI, PA, acrylic resin, and phenol resin, which are typical organic materials.

Figure 1F:
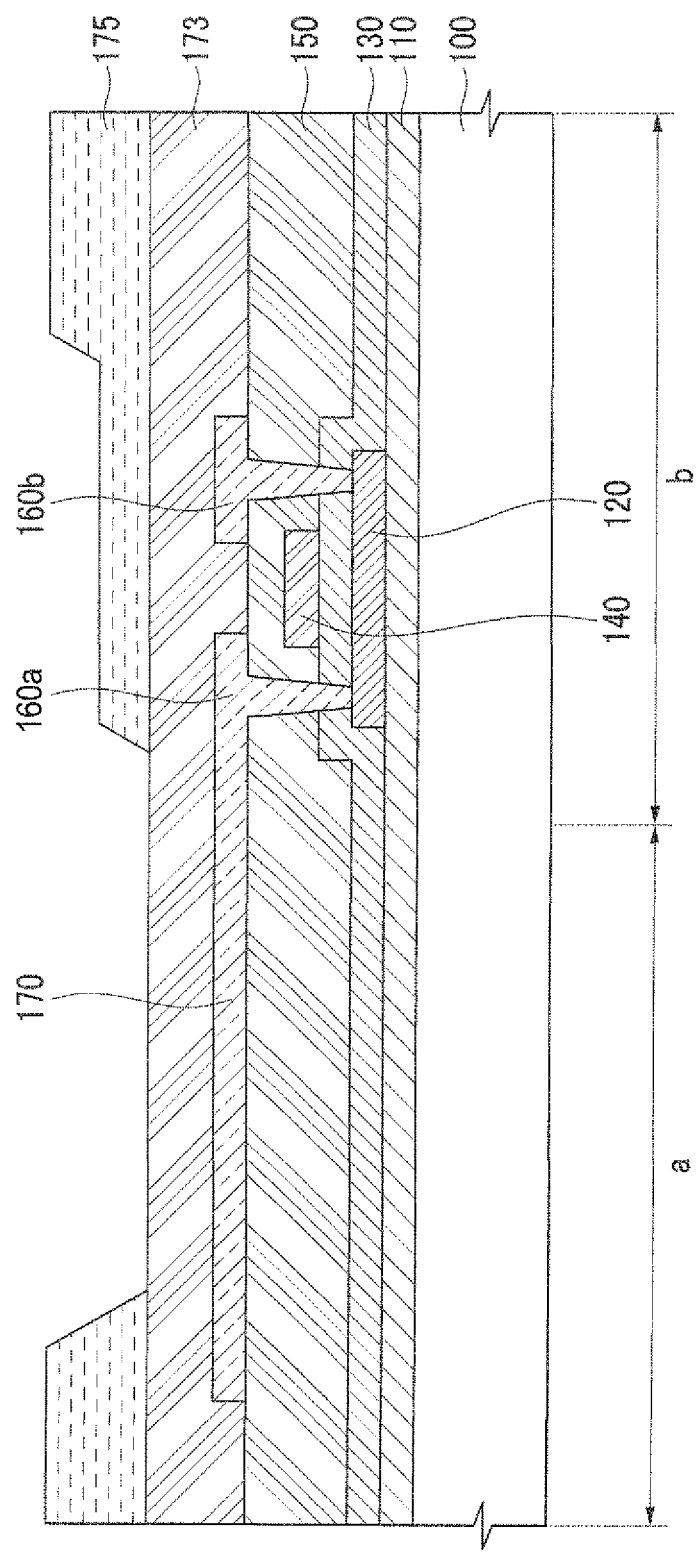

Referring to FIG. 1F, the material layer, i.e. the organic layer, for the spacer 175 is ashed using a half-tone mask, a fifth mask, thereby removing a part of the organic layer located on the emission section a, so that an organic layer pattern is left on a part of the non-emission section b.

Figure 1G:
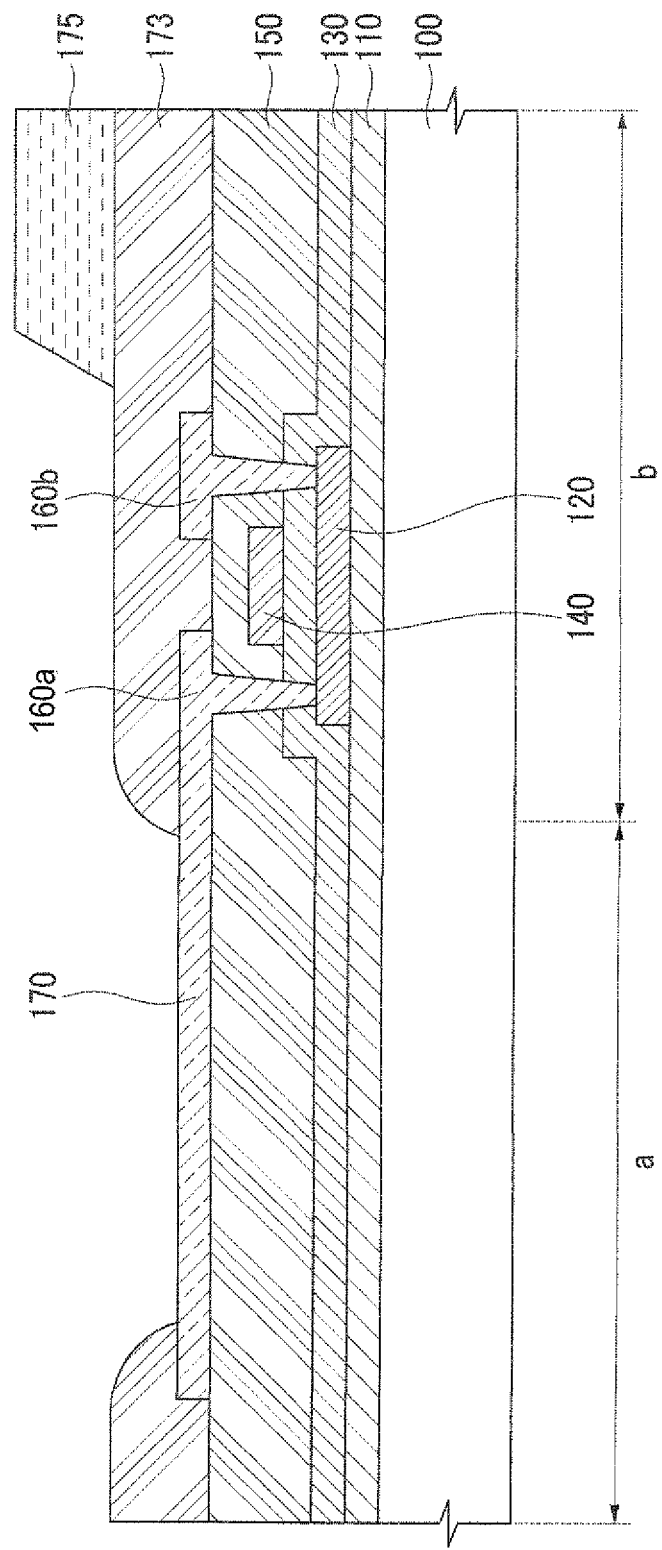

Then, as seen in FIG. 1G, the material layer, i.e. the inorganic layer, for the pixel definition layer 173 is dry-etched to expose a part of the first electrode 170. In this manner, a part of the material layer for the pixel definition layer 173 is removed by etching, and thus a part of the first electrode 170 located on the emission section is exposed, so that the pixel definition layer 173 defining a pixel is formed. The organic layer for the spacer 175 is ashed, so that the spacer 175, i.e. the organic layer pattern, located on the non-emission section is formed.

In this regard, since the pixel definition layer 173 is formed of the inorganic layer, it is possible to prevent the source and drain electrodes 160a and 160b, respectively, from being damaged, which is a problem occurring when the pixel definition layer 173 is formed of an organic layer and when the source and drain electrodes 160a and 160b, respectively, are formed parallel to the first electrode 170. The pixel definition layer 173 and the spacer 175 are formed using one mask process, so that it is possible to produce a reliable device, and cut down the cost of production.

Furthermore, when the pixel definition layer 173 is formed using the inorganic layer, i.e. the silicon nitride ($SiN_x$) layer, amounts of silane gas and ammonium gas are adjusted so that the silicon nitride layer contains 18 wt % or less of Si. This is because, when the pixel definition layer 173 is formed on the ITO electrode using the silicon nitride layer, and when the content of Si of the silicon nitride layer is high, indium (In) of the ITO electrode migrates to the silicon nitride layer, thereby influencing the pixel definition layer 173, and thus characteristics of the device.

Figure 1H:
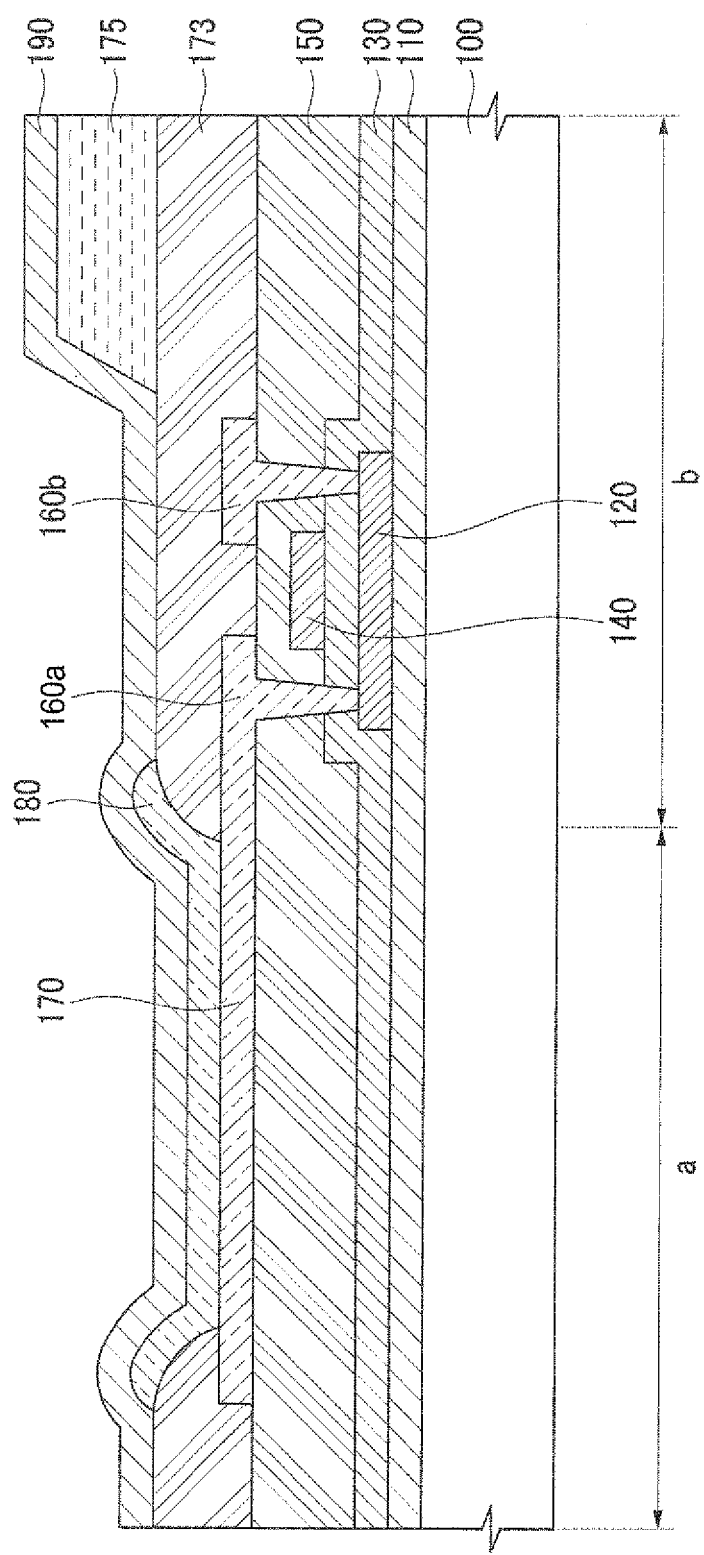
Figure 1I:
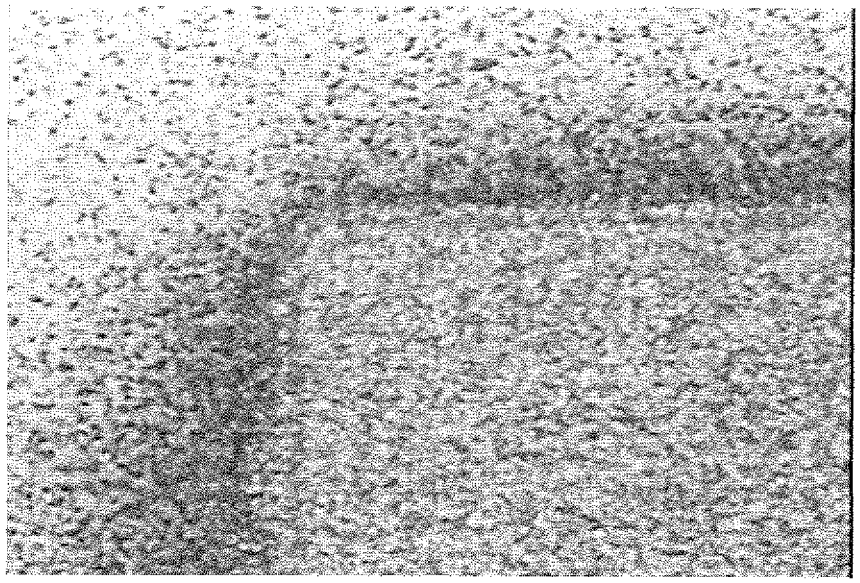
FIGS. 1I thru 1L are microscopic photographs of a pixel electrode formed of a silicon nitride layer.
Figure 1J:
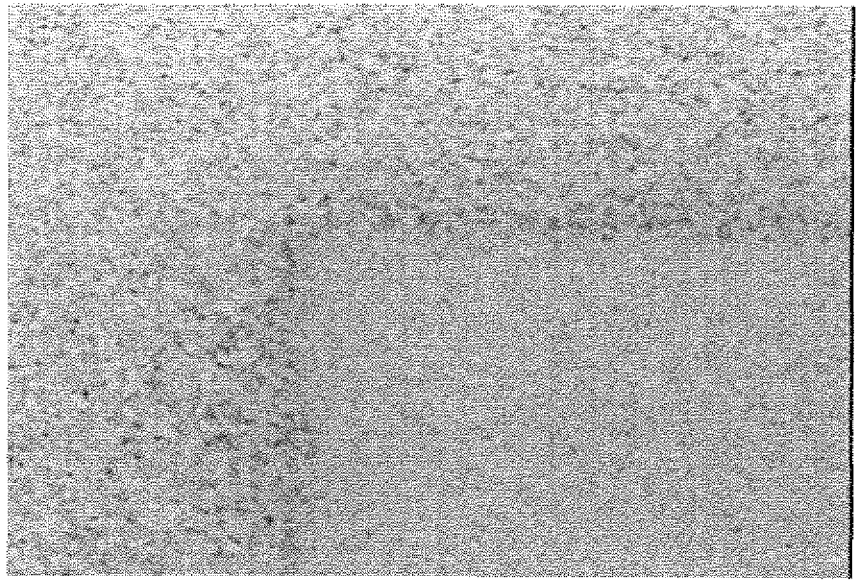
Figure 1K:
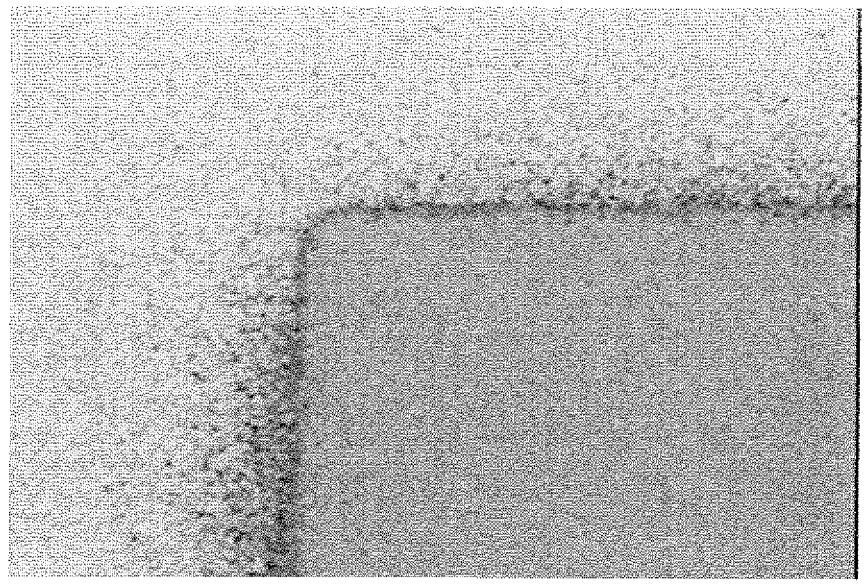
Figure 1L:
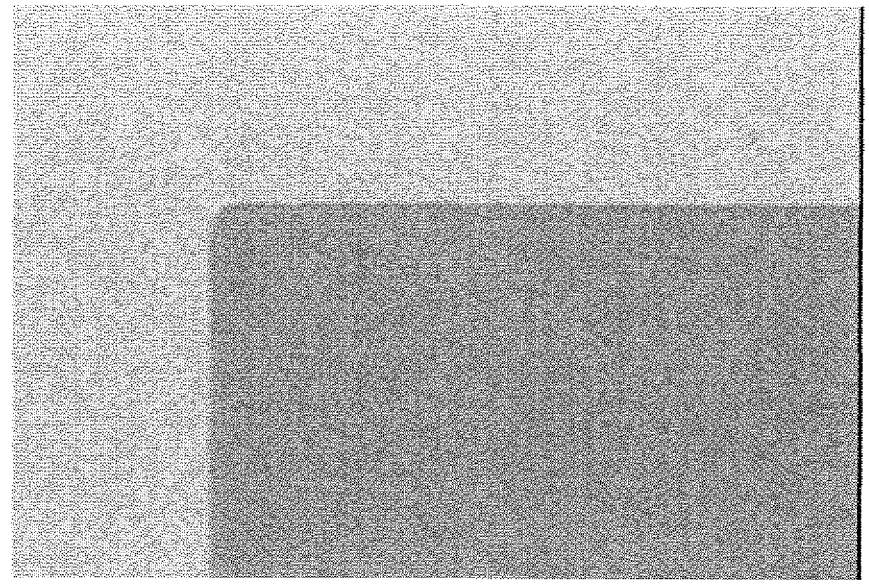

FIGS. 1I thru 1L are microscopic photographs of a pixel region coated with a silicon nitride layer, wherein FIG. 1I shows a case wherein the silicon nitride layer contains 47 wt % of Si, FIG. 1J shows a case wherein the silicon nitride layer contains 40 wt % of Si, FIG. 1K shows a case wherein the silicon nitride layer contains 31 wt % of Si, and FIG. 1L shows a case wherein the silicon nitride layer contains 18 wt % of Si. Referring to FIGS. 1I thru 1L, it can be seen that an amount of indium absorbed into the silicon nitride layer containing 47 wt % of Si is maximum, and an amount of indium absorbed into the silicon nitride layer containing 18 wt % of Si is minimum, i.e. that, as the content of Si decreases, the amount of In decreases.

Finally, referring to FIG. 1H, an organic film layer 180 including an organic emission layer is formed on the exposed first electrode 170, and then a second electrode 190 is formed over the entire front surface of the substrate 100. Thereby, the organic light emitting diode display device according to a first embodiment is finished.

Second Embodiment

FIGS. 2A thru 2H illustrate an organic light emitting diode display device according to a second embodiment of the invention.

Figure 2A:
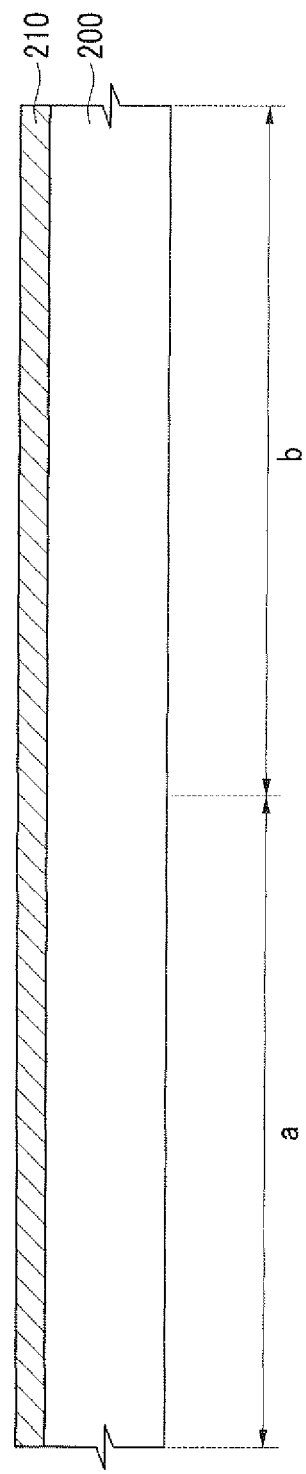

First, referring to FIG. 2A, as in the first embodiment, a substrate 200 having an emission section a and non-emission section b is provided. The substrate 200 is formed of a material such as glass or plastic. Then, a buffer layer 210 is formed on the substrate 200. The buffer layer 210 is formed of at least one of dielectric layers, for instance, a silicon oxide layer and a silicon nitride layer, using chemical or physical vapor deposition.

Figure 2B:
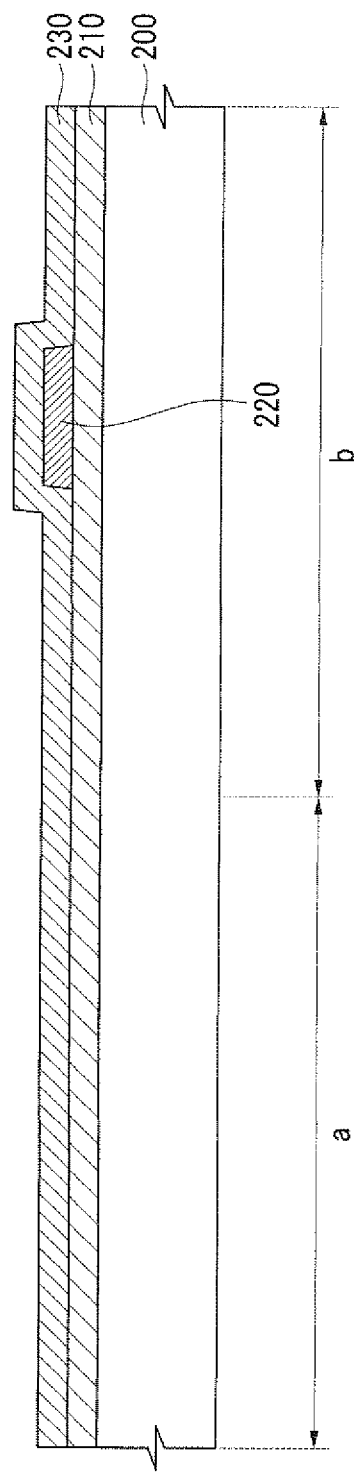

Referring to FIG. 2B, a gate electrode 220 is formed on the substrate 200 using a first mask. Then, a gate dielectric layer 230 is formed over an entire front surface of the substrate 200. The gate electrode 220 and the gate dielectric layer 230 are formed as in the first embodiment.

Figure 2C:
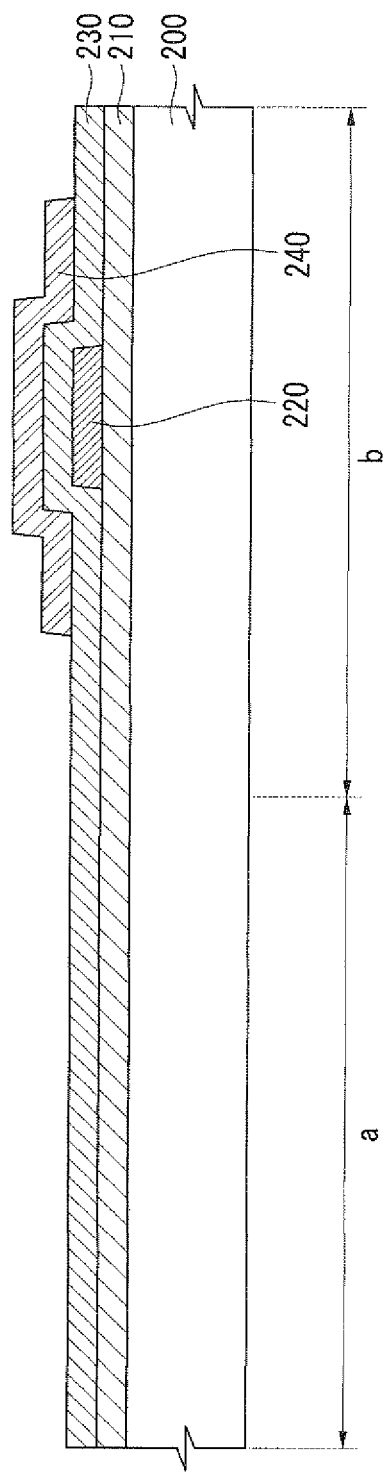

Then, referring to FIG. 2C, a semiconductor layer 240 is formed on the gate dielectric layer 230 so as to correspond to the gate electrode 220. The semiconductor layer 240 is formed using a second mask.

Figure 2D:
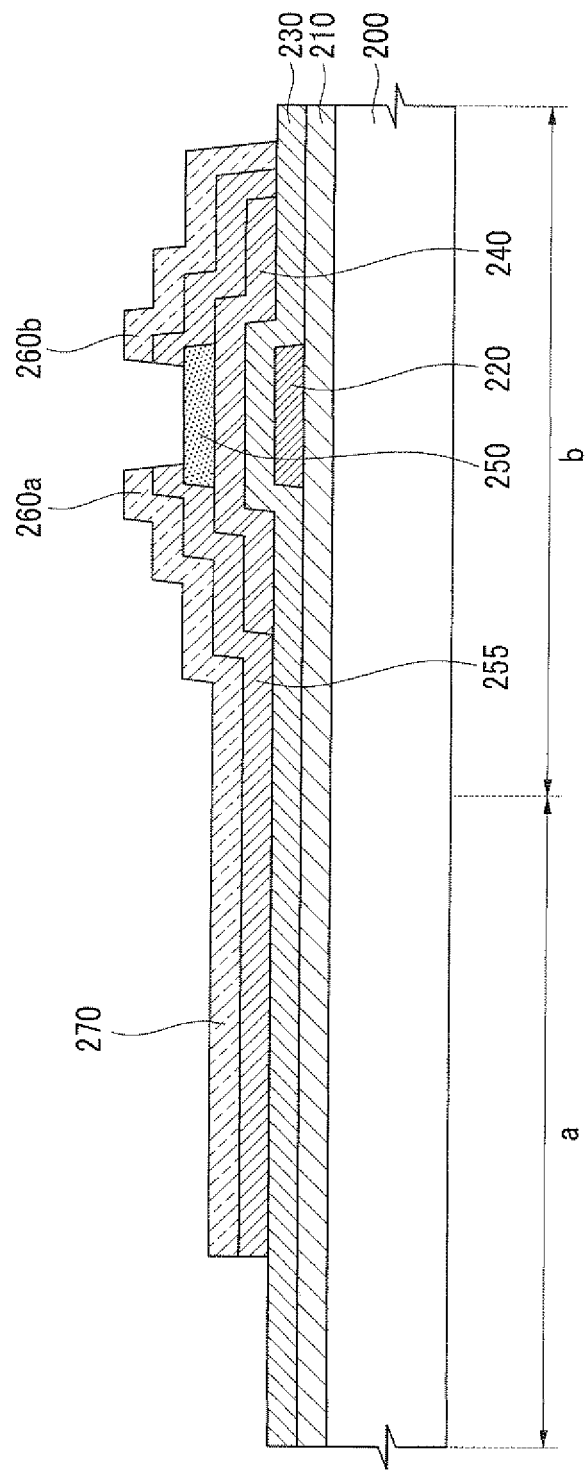

Referring to FIG. 2D, an etch stop layer 250 is formed on the semiconductor layer 240 using a third mask so as to prevent damage to the semiconductor layer 240. Then, source and drain electrodes 260a and 260b, respectively, and a first electrode 270 are formed using a fourth mask so as to be electrically connected to the semiconductor layer 240.

In this regard, the source and drain electrodes 260a and 260b, respectively, and the first electrode 270 are formed by stacking and patterning a metal layer (not shown) for the source and drain electrodes 260a and 260b, respectively, and a metal layer (not shown) for the first electrode 270, both of which are the same material, using the same mask at the same time. Further, a contact layer 255 is located under the source and drain electrodes 260a and 260b, respectively, and the first electrode 270. Thus, the contact layer 255 is interposed between the semiconductor layer 240 and the source and drain electrodes 260a and 260b, respectively.

Figure 2E:
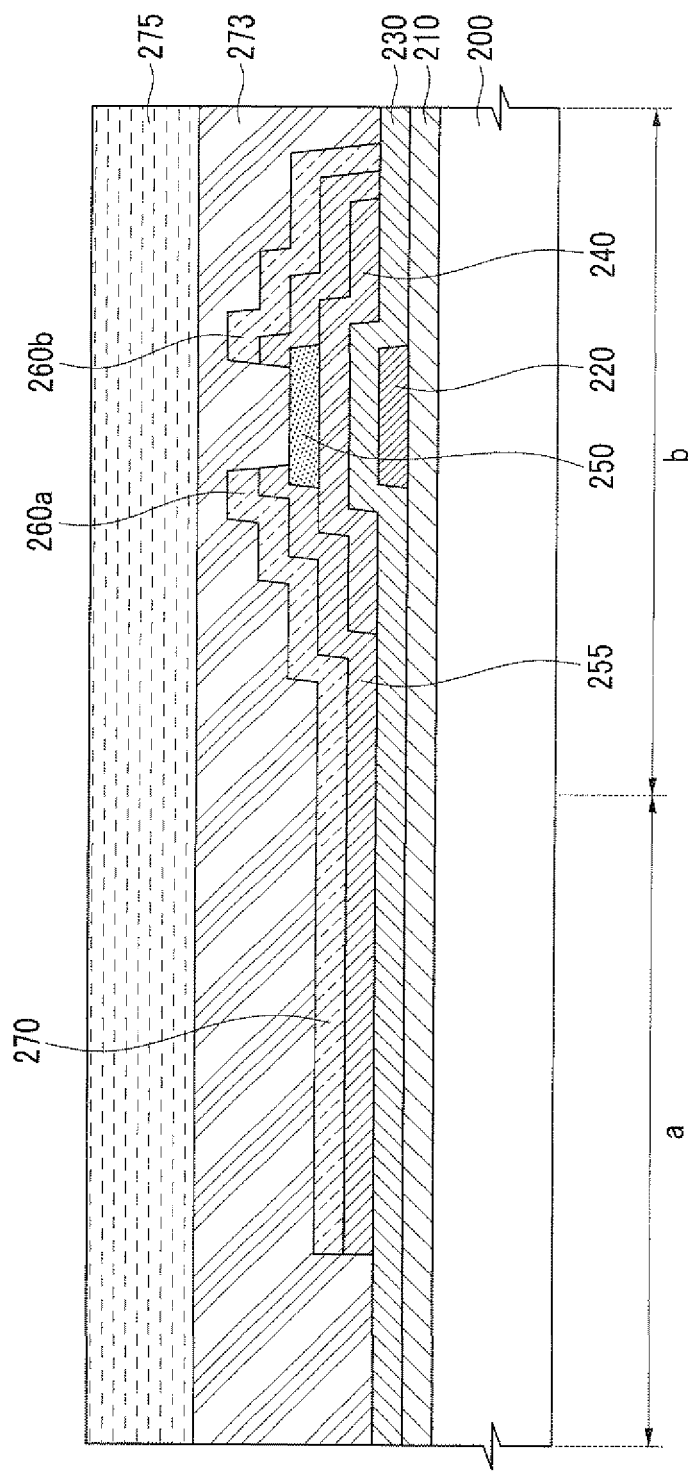

Then, referring to FIG. 2E, material layers for a pixel definition layer 273 and a spacer 275 are formed over an entire front surface of the substrate 200.

The material layer for the pixel definition layer 273 is formed of an inorganic layer, and the material layer for the spacer 275 is formed of an organic layer. In the same fashion as described in the first embodiment, the material layers for the pixel definition layer 273 and the spacer 275 are formed.

Referring to FIG. 2F, the material layer for the spacer 275 is ashed using a fifth mask, thereby exposing a part of the emission section a of the substrate 200. The fifth mask is the same mask, i.e. the half-tone mask, as described in the first embodiment, so that it is possible to adjust a degree to which the organic layer is ashed.

Figure 2G:
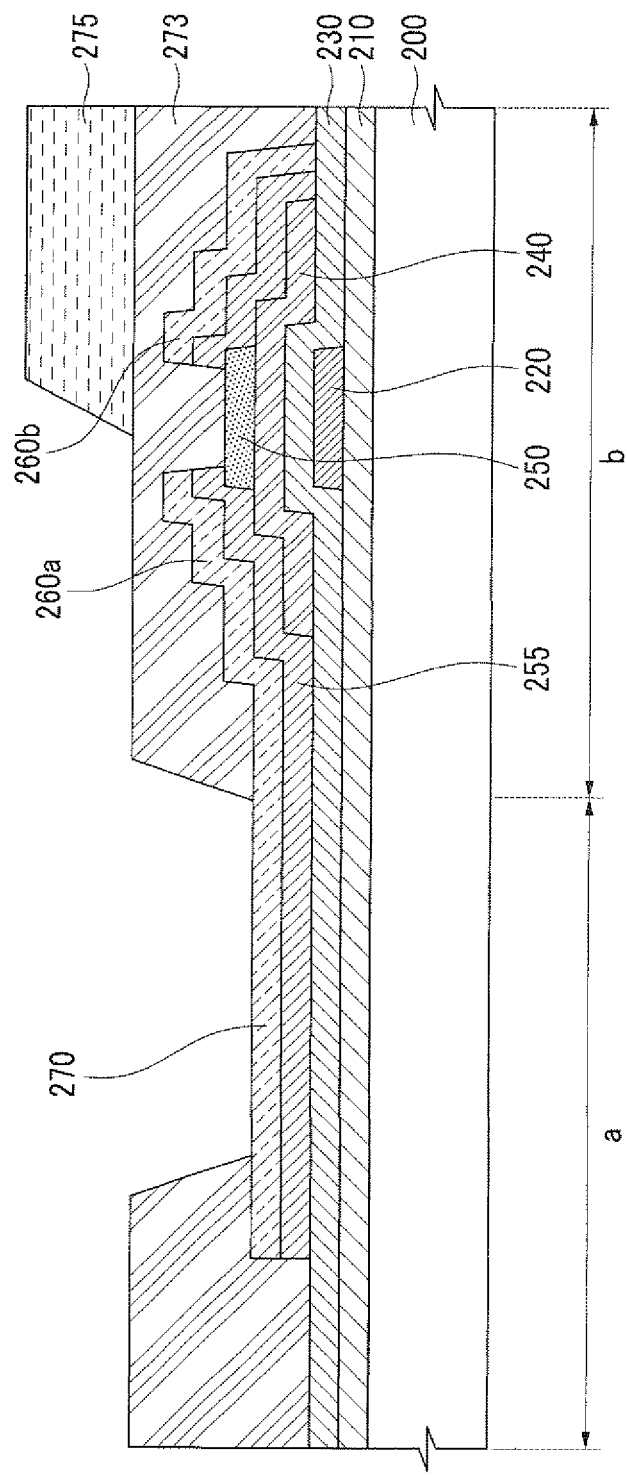

Then, referring to FIG. 2G, the material layer, i.e. the inorganic layer, for the pixel definition layer 273 is etched to expose a part of the first electrode 270. The pixel definition layer 273 defining a pixel and the spacer 275 located on the non-emission section b of the substrate 200 are formed.

Figure 2H:
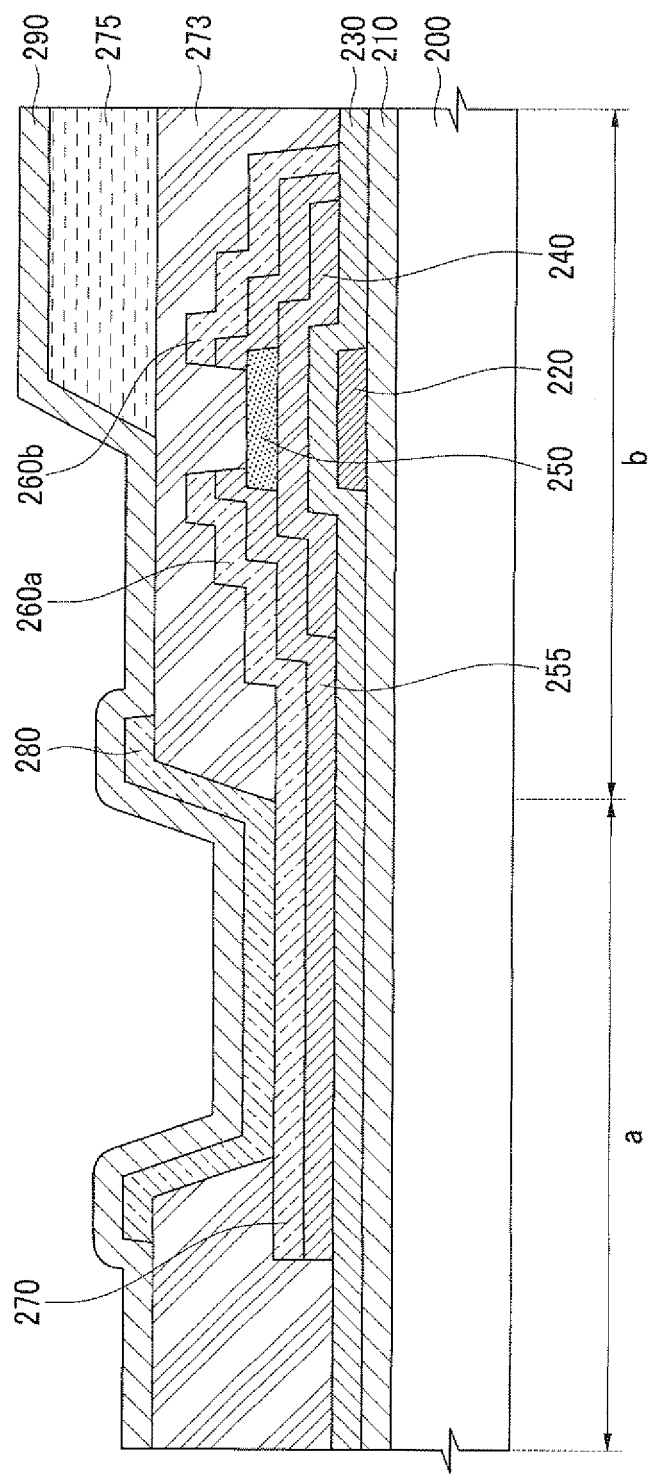

Next, referring to FIG. 2H, an organic film layer 280 including an organic emission layer is formed on the exposed first electrode 270, and then a second electrode 290 is formed over the entire front surface of the substrate 100. Thereby, the organic light emitting diode display device according to a second embodiment is finished.

In comparison to the first embodiment, only the positions of the gate electrode and the semiconductor layer are different. The materials applied to the semiconductor layer, the gate electrode, the source and drain electrodes, the first electrode, and the second electrode are the same as in the first embodiment.

According to exemplary embodiments, the organic light emitting diode display device is configured such that a pixel definition layer is formed of an optimized inorganic layer, and is simultaneously formed along with a spacer. As a result, it is possible to reduce the mask process and production time so as to cut down the cost of production, and to enhance yield.

Although a few embodiments have been shown and described, it will be appreciated by those skilled in the art that changes may be made in this embodiment without departing from the principles and spirit of the invention, the scope of which is defined in the claims and their equivalents.

What is claimed is:

1. An organic light emitting diode display device, comprising:
   a substrate having an emission section and a non-emission section;
   a semiconductor layer located on the substrate;
   a gate dielectric layer located over an entire front surface of the substrate;
   a gate electrode located in correspondence to the semiconductor layer;
   a dielectric layer located over the entire front surface of the substrate;
   source and drain electrodes and a first electrode located on the dielectric layer and electrically connected to the semiconductor layer, the first electrode being located on the emission section of the substrate;
   a pixel definition layer comprised of a silicon-containing inorganic layer having no greater than 18 wt % of silicon, the pixel definition layer defining an opening that exposes a part of the first electrode, the inorganic layer of the pixel definition layer overlaying a region that includes the source electrode and drain electrode;
   a spacer comprised of an organic layer, the spacer being located on the pixel definition layer and located on the non-emission section of the substrate;
   an organic film layer located within the opening and upon the first electrode; and
   a second electrode located over the entire front surface of the substrate,
   wherein the spacer does not overlap the organic film layer.

2. The organic light emitting diode display device according to claim 1, the spacer including one selected from the group consisting of benzo cyclo butene (BCB), polyimide (PI), polyamide (PA), acrylic resin, and phenol resin.

3. The organic light emitting diode display device according to claim 1, comprised of the pixel definition layer including a silicon nitride layer.

4. The organic light emitting diode display device according to claim 1, the source and drain electrodes being formed of a same material as the first electrode.

5. The organic light emitting diode display device according to claim 4, comprised of the source and drain electrodes having a multiple layer in which a metal layer for the source and drain electrodes and a metal layer for the first electrode are stacked.

6. The organic light emitting diode display device according to claim 1, comprised of the dielectric layer including a mixture layer in which one of a silicon nitride layer, a silicon oxide layer, and a multiple layer thereof is mixed with a layer formed of one selected from the group consisting of BCB, PI, PA, acrylic resin, and phenol resin.

7. The organic light emitting diode display device according to claim 1, the inorganic layer of the pixel definition layer being in contact with a portion of the organic film layer.

* * * * *